United States Patent
Aude (10) Patent No.: US 6,747,514 B1
(45) Date of Patent: Jun. 8, 2004

(54) MOSFET AMPLIFIER WITH DYNAMICALLY BIASED CASCODE OUTPUT

(75) Inventor: Arlo Aude, Atlanta, GA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/374,565

(22) Filed: Feb. 25, 2003

(51) Int. Cl.$^7$ ............................................ H03F 3/45
(52) U.S. Cl. ................................ 330/253; 330/261
(58) Field of Search ............................ 330/253, 257, 330/258, 259, 261; 327/359

(56) References Cited

U.S. PATENT DOCUMENTS

| | | | |
|---|---|---|---|
| 4,550,284 A | 10/1985 | Sooch | |
| 5,789,980 A | * 8/1998 | Nagata et al. | 330/253 |
| 6,052,025 A | * 4/2000 | Chang et al. | 330/253 |
| 6,538,513 B2 | * 3/2003 | Godfrey et al. | 330/258 |

* cited by examiner

Primary Examiner—Henry Choe
(74) Attorney, Agent, or Firm—Vedder, Price, Kaufman & Kammholz, P.C.

(57) ABSTRACT

A metal oxide semiconductor field effect transistor (MOSFET) amplifier with dynamically biased cascode output circuitry in which the biasing of the cascode output circuitry dynamically tracks one or more other internal amplifier bias voltages such that operation of each transistor in the input signal circuitry is maintained in a state of saturation.

19 Claims, 4 Drawing Sheets

MOSFET AMPLIFIER WITH DYNAMICALLY BIASED CASCODE OUTPUT

BACKGROUND OF THE INVENTION

1. Field of the Invention

The present invention relates to metal oxide semiconductor field effect transistor (MOSFET) amplifiers with cascode outputs, and in particular, MOSFET amplifiers with cascode outputs biased to maintain operation of their driver transistors in states of saturation.

2. Description of the Related Art

Many amplifier circuits using MOSFETs (P-type or N-type, or both) are increasingly relying upon the use of cascode output devices for maintaining or increasing the amplifier output impedance. This has become increasingly important as transistor sizes, particularly MOSFET channel lengths, become smaller with increased integrated circuit densities. This is true for current mirror circuits (e.g., as discussed in more detail in U.S. Pat. No. 4,550,284, the disclosure of which is incorporated herein by reference) as well as signal amplifiers.

One type of signal amplifier relying upon cascode output transistors is that in which the signal to be amplified or buffered is an AC signal centered about a DC baseline, or common mode, voltage. Such an amplifier, whether differential or single-ended, often relies upon the use of a current mirror circuit for providing the amplifier biasing current to the transistor or transistors responsible for amplifying the incoming signal. Following such transistor or transistors, is the cascode output circuitry responsible for maintaining or increasing the output impedance.

Two difficulties are often encountered in biasing such circuitry. One difficulty involves the biasing of the current mirror providing the amplifier biasing current. Depending upon the magnitude and stability of the DC power supply voltage, the biasing of the current mirror circuitry can vary, thereby causing the amplifier biasing current to vary as well. A second difficulty concerns the biasing of the cascode output circuitry. Such biasing is usually done by applying a fixed voltage relative to the power supply voltage. However, while such bias voltage may remain constant, the baseline, or common mode, voltage associated with the input signal may vary, thereby preventing the input transistors from operating in true states of saturation, particularly over PVT (i.e., variations in device fabrication Processing, power supply Voltage and operating Temperature).

SUMMARY OF THE INVENTION

In accordance with the presently claimed invention, a metal oxide semiconductor field effect transistor (MOSFET) amplifier includes dynamically biased cascode output circuitry in which the biasing of the cascode output circuitry dynamically tracks one or more other internal amplifier bias voltages such that operation of each transistor in the input signal circuitry is maintained in a state of saturation.

In accordance with one embodiment of the presently claimed invention, a metal oxide semiconductor field effect transistor (MOSFET) amplifier with dynamically biased cascode output circuitry includes power supply terminals, telescopic cascode amplifier circuitry, voltage replication circuitry and voltage translation circuitry. The power supply terminals convey first and second voltages defining a power supply voltage. The telescopic cascode amplifier circuitry, coupled between the power supply terminals, responds to reception of a current source bias voltage intermediate the first and second voltages, an input signal centered about an input baseline voltage intermediate the first and current source bias voltages, and at least one cascode bias voltage intermediate the first and input baseline voltages by providing a first internal bias voltage intermediate the current source bias and input baseline voltages, a second internal bias voltage intermediate the input baseline and at least one cascode bias voltages, and an output signal corresponding to the input signal and centered about an output baseline voltage intermediate the first and cascode bias voltages. The voltage replication circuitry, coupled to the telescopic cascode amplifier circuitry, responds to reception of the input baseline voltage and a first bias current by providing the current source bias voltage and a first replica bias voltage substantially equal to the first internal bias voltage. The voltage translation circuitry, coupled to the voltage replication circuitry and the telescopic cascode amplifier circuitry, responds to reception of the current source bias voltage, the first replica bias voltage and a second bias current related to the first bias current by providing a first one of the at least one cascode bias voltage.

In accordance with another embodiment of the presently claimed invention, such MOSFET amplifier with dynamically biased cascode output circuitry further includes additional voltage replication circuitry and additional voltage translation circuitry. The additional voltage replication circuitry, coupled to the first voltage translation circuitry, responds to reception of the first one of the at least one cascode bias voltage and a third bias current related to the first bias current by providing a current mirror bias voltage and a second replica bias voltage substantially equal to the second internal bias voltage. The additional voltage translation circuitry, coupled to the additional voltage replication circuitry and the telescopic cascode amplifier circuitry, responds to reception of the current mirror bias voltage, the second replica bias voltage and a fourth bias current related to the first bias current by providing a second one of the at least one cascode bias voltage.

DETAILED DESCRIPTION OF THE INVENTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together to provide the described function. Additionally, the term "signal" may refer to one or more currents, one or more voltages, or a data signal. Within the drawings, like or related elements will have like or related alpha, numeric or alphanumeric designators.

Figure 1:
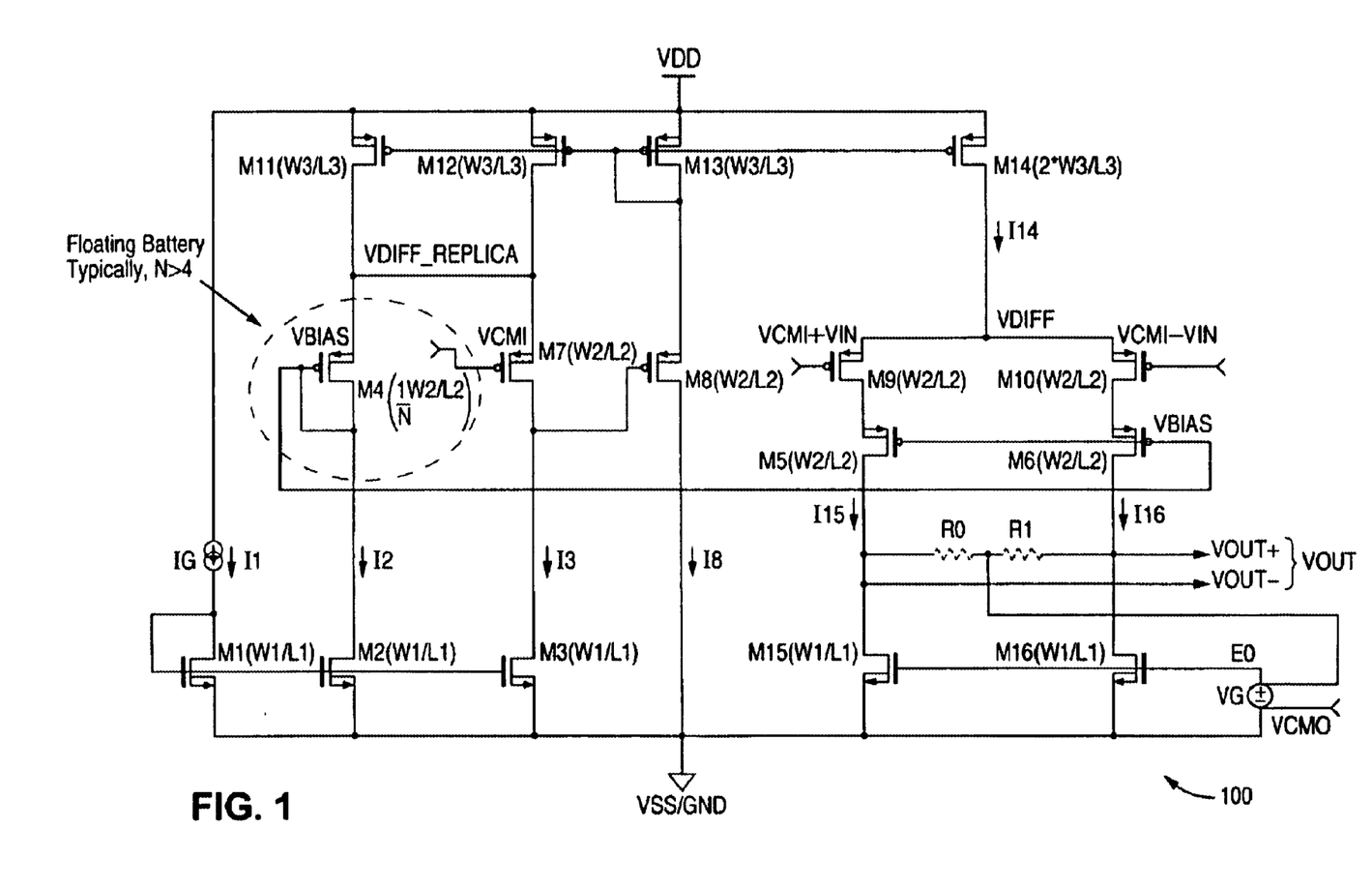
FIG. 1 is a schematic diagram of a MOSFET amplifier circuit with dynamically biased cascode output circuitry in accordance with one embodiment of the presently claimed invention.

Referring to FIG. 1, a MOSFET amplifier with dynamically biased cascode output circuitry in accordance with one embodiment 100 of the presently claimed invention is implemented as a differential amplifier biased with a current mirror circuit and dynamic voltage biasing for the cascode output circuitry. This circuit 100 is biased with a power supply voltage defined by the positive VDD and negative VSS (or ground GND) voltages applied at the power supply terminals. The differential input signal VIN centered about its baseline, or common mode, input voltage VCMI, is applied to the gate terminals of P-MOSFETs M9 and M10 which form the differential input pair. (As indicated, each of the MOSFETs has width W and length L dimensions as well as width-to-length W/L ratios associated with them.) These input transistors M9, M10 are provided a biasing current I14 from P-MOSFET M14 (discussed in more detail below). Depending upon the input signal VIN, this current I14 is divided between the two output branch currents I15, I16 conveyed by the cascode output transistors M5, M6. These output currents I15, I16, in conjunction with load resistors R0, R1 establish the output voltage VOUT. Current sink N-MOSFETs M15, M16 establish the lower biasing for the differential amplifier circuitry, with their gate terminal biasing voltage E0 provided by a voltage generator VG which also maintains the node connecting the load resistors R0, R1 at the common mode output voltage VCMO in accordance with well known techniques.

It will be appreciated that while the presently claimed invention is discussed in the context of embodiments in which various differential or single-ended output amplifier stages are used, the specific topology of the output amplifier stage (e.g., differential versus single-ended) is not the focus of the subject invention.

As discussed in more detail below, transistor M14 provides an accurate replication, or mirror, current I14 relative to current I3 by accounting for the voltage VDIFF appearing at the source terminals of the input transistors M9, M10, which must be maintained at one gate-to-source voltage potential VGS aboxIe the input baseline voltage VCMI. Additionally, the bias voltage VBIAS for the cascode output transistors M5, M6 is maintained (via voltage tracking as discussed in more detail below) at a voltage level relative to voltage VDIFF.

A current generator IG provides a reference current I1 to N-MOSFET M1 which serves as the input transistor to a current replication, or mirror, circuit formed by N-MOSFETs M2 and M3. Accordingly, currents I2 and I3 will mirror the reference current I1 in proportion to their respective transistor channel ratios in accordance with well known principles. Current I3 is provided to P-MOSFETs M12, and M7 which together with P-MOSFETs M8 and M13 form a voltage replication circuit. Transistor M7 is driven by the input signal baseline voltage VCMI and conveys current I3 to transistor M12 which establishes a current source bias voltage at its gate terminal for biasing current mirror transistor M14. Transistors M8 and M13 serve as a voltage level shifting buffer and establish a feedback loop for the voltage appearing at the drain terminal of transistor M7 to maintain the voltage appearing at the gate terminals of transistors M12, M13 and M14 such that the replica voltage VDIFF_REPLICA appearing at the source terminal of transistor M7 is equal to voltage VDIFF in the output amplifier. Accordingly, equal drain-to-source voltages VDS are maintained across current mirror transistors M12 and M14.

The dynamic biasing voltage VBIAS for the cascode output transistors M5, M6 is provided by voltage translation circuitry formed by P-MOSFETs M11 and M4. Mirror current I2 from transistor M2 is provided to transistors M4 and M11, as is the replica bias voltage VDIFF_REPLICA. Transistor M4 serves as a current source cascode transistor and has transistor channel dimensions such that its width-to-length ratio W2/L2 is smaller by a factor of N than the corresponding dimensions W2/L2 of the cascode output transistors M5, M6 (i.e., 1/N*W2/L2 versus W2/L2). In accordance with well known principles (e.g., see U.S. Pat. No. 4,550,284, the disclosure of which is incorporated herein by reference), with such size factor N being greater than or equal to four. This results in a gate-to-source voltage VGS for transistor M4 being substantially equal to the sum of the gate-to-source voltage VGS of the cascode output transistor M5/M6 and the drain-to-source voltage VDS of the input transistor M9/M10. Accordingly, this maintains a sufficient drain-to-source voltage VDS for the input transistors M9 and M10 to remain operating in their saturation regions. This can be mathematically summarized as follows:

$$\text{VDIFF-VBIAS} = \text{VDIFF\_REPLICA-VBIAS}$$
$$= \text{VGS(M4)}$$
$$= \text{VGS(M5/M6)} + \text{VDS(M9/M10)}$$

As indicated in FIG. 1, the bulk connections of transistors M4, M7, M8, M9, M10, M5 and M6 are all connected to the source terminal. While this is preferable, it is not necessary. For example, if such connections are not made, e.g., the bulk connections are instead tied to one of the power supply terminals, then the channel dimensions of transistor M4 must be further reduced, i.e., transistor size factor N must be increased.

Figure 2:
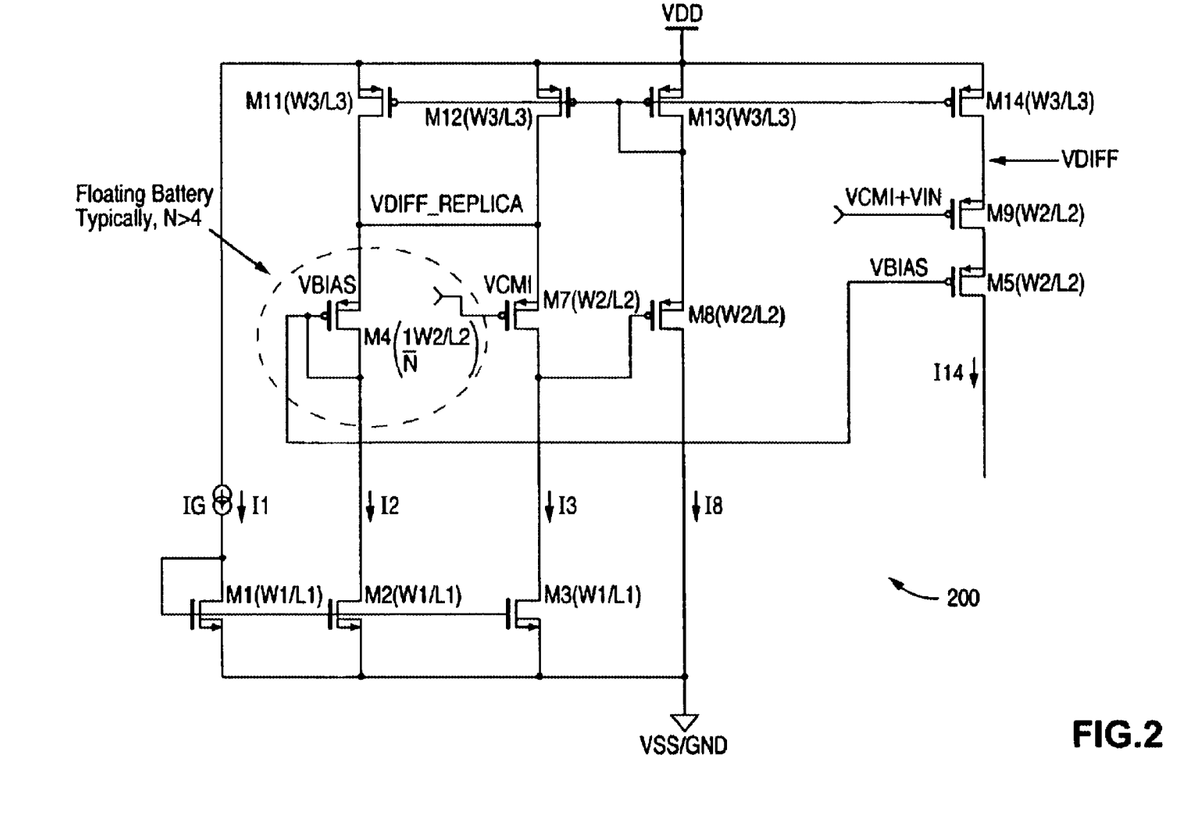
FIG. 2 is a schematic diagram of a MOSFET amplifier with dynamically biased cascode output circuitry in accordance with another embodiment of the presently claimed invention.

Referring to FIG. 2, another embodiment 200 of the presently claimed invention provides dynamic biasing for cascode output circuitry in a single-ended amplifier configuration. As before, transistor M14 provides the amplifier current I14 which is controlled by input transistor M9 in accordance with the input signal VCMI+VIN. As with the circuit 100 of FIG. 1, the cascode output transistor M5 is biased by the dynamic biasing voltage VBIAS such that the difference between voltages VBIAS and VDIFF are maintained such that the input transistor M9 operates consistently in its saturation region.

Figure 3:
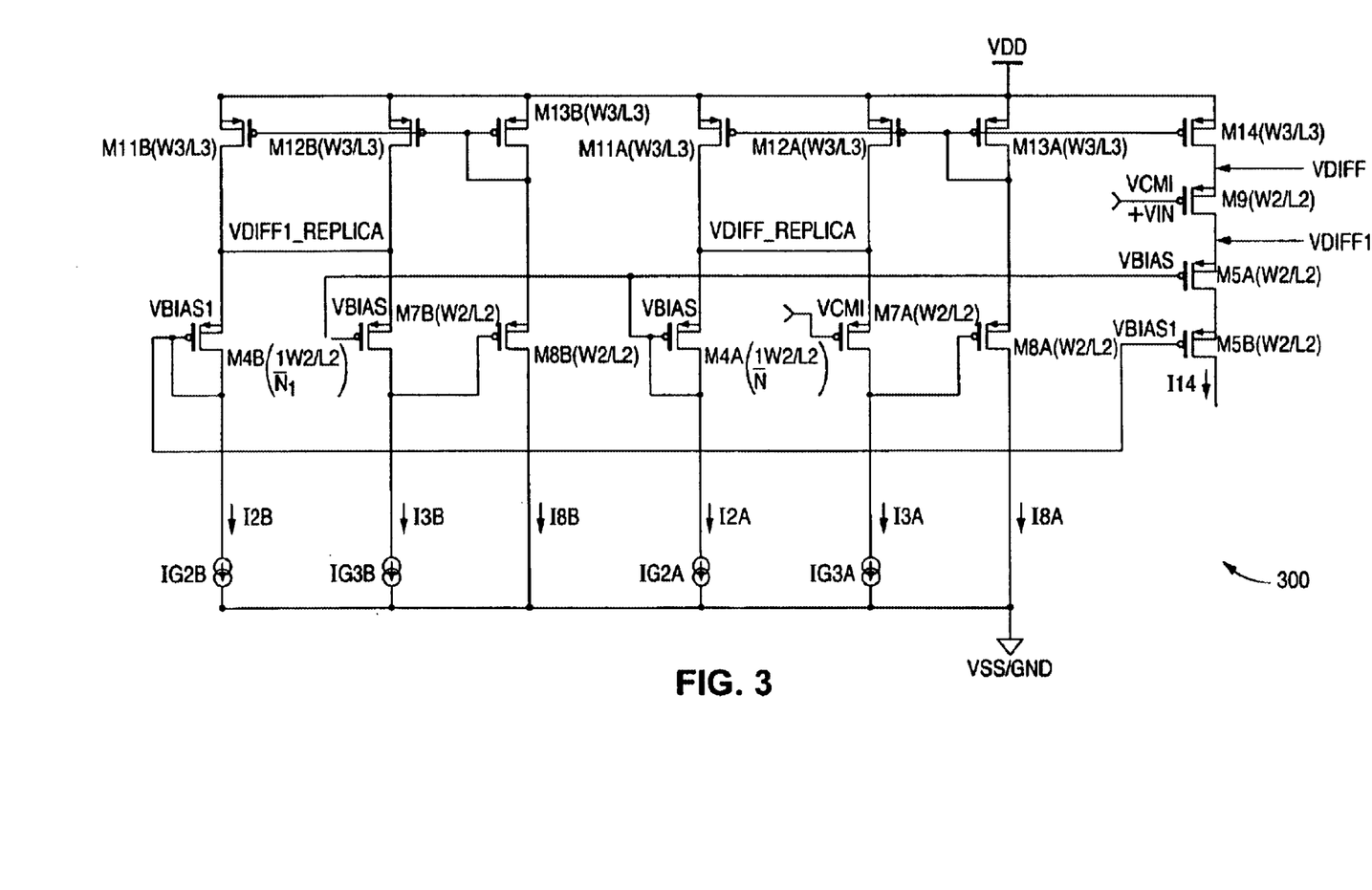
FIG. 3 is a schematic diagram of a MOSFET amplifier with dynamically biased cascode output circuitry in accordance with still another embodiment of the presently claimed invention.

Referring to FIG. 3, another embodiment 300 of the presently claimed invention has cascode output circuitry with multiple cascode transistors M5A, M5B connected in series. The first cascode output transistor M5A receives its dynamic biasing voltage VBIAS which is generated in conformance with the discussion above concerning the circuit 100 of FIG. 1 so as to maintain the saturation operation state of input transistor M9. The second cascode output transistor M5B also receives a dynamic biasing voltage VBIAS1 which is generated so as to dynamically maintain the desired voltage difference between VBIAS1 and the voltage VDIFF1 appearing at the mutual connection of input transistor M9 and first cascode output transistor M5A.

This circuit 300 uses a second voltage replication circuit in the form of transistors M7B, M12B, M8B and M13B, as well as a second voltage translation circuit formed by transistors M4B and M11B.

It should be noted that the similarly numbered transistors with "A" and "B" suffixes perform similar functions. Current sources IG2B, IG3B, IG2A and IG3A provide the biasing currents I2B, I3B, I2A, I3A and can be implemented in accordance with any well known technique, such as current mirror circuitry as discussed above in connection with the circuit 100 of FIG. 1.

In the second voltage replication circuit, the dynamic biasing voltage VBIAS generated by the first voltage translation circuitry provides the gate bias voltage for transistor M7B which with transistors M12B, M8B and M13B, in conformance with the discussion above for transistors M7, M12, M8 and M13 in the circuit 100 of FIG. 1, generates a replica voltage VDIFF1_REPLICA at its source terminal equal to the output circuit voltage VDIFF1 appearing at the drain terminal at the input transistor M9.

In the second voltage translation circuit, current source cascode transistor M4B, in conjunction with transistor M11B in conformance with the discussion of transistors M4 and M11 in the circuit 100 of FIG. 1, generates the second dynamic biasing voltage VBIAS1 for the second cascode output transistor M5B. This current source cascode transistor M4B, similar to the first current source cascode transistor M4A, has channel dimensions such that its width-to-length ratio is smaller by another size factor of N1 than its associated output cascode transistor M5B. As a result, the dynamic cascode biasing voltages VBIAS, VBIAS1 are maintained at levels relative to their associated output voltages VDIFF, VDIFF1 such that the input transistor M9 and first cascode output transistor M5A are maintained in their respective saturation operation states. This can be mathematically summarized as follows:

$$VDIFF - VBIAS = VDIFF\_REPLICA - VBIAS$$
$$= VGS(M4A)$$
$$= VGS(M5A) + VDS(M9)$$
$$VDIFF1 - VBIAS1 = VDIFF1\_REPLICA - VBIAS1$$
$$= VGS(M4B)$$
$$= VGS(M5B) + VDS(M5A)$$

Figure 4:
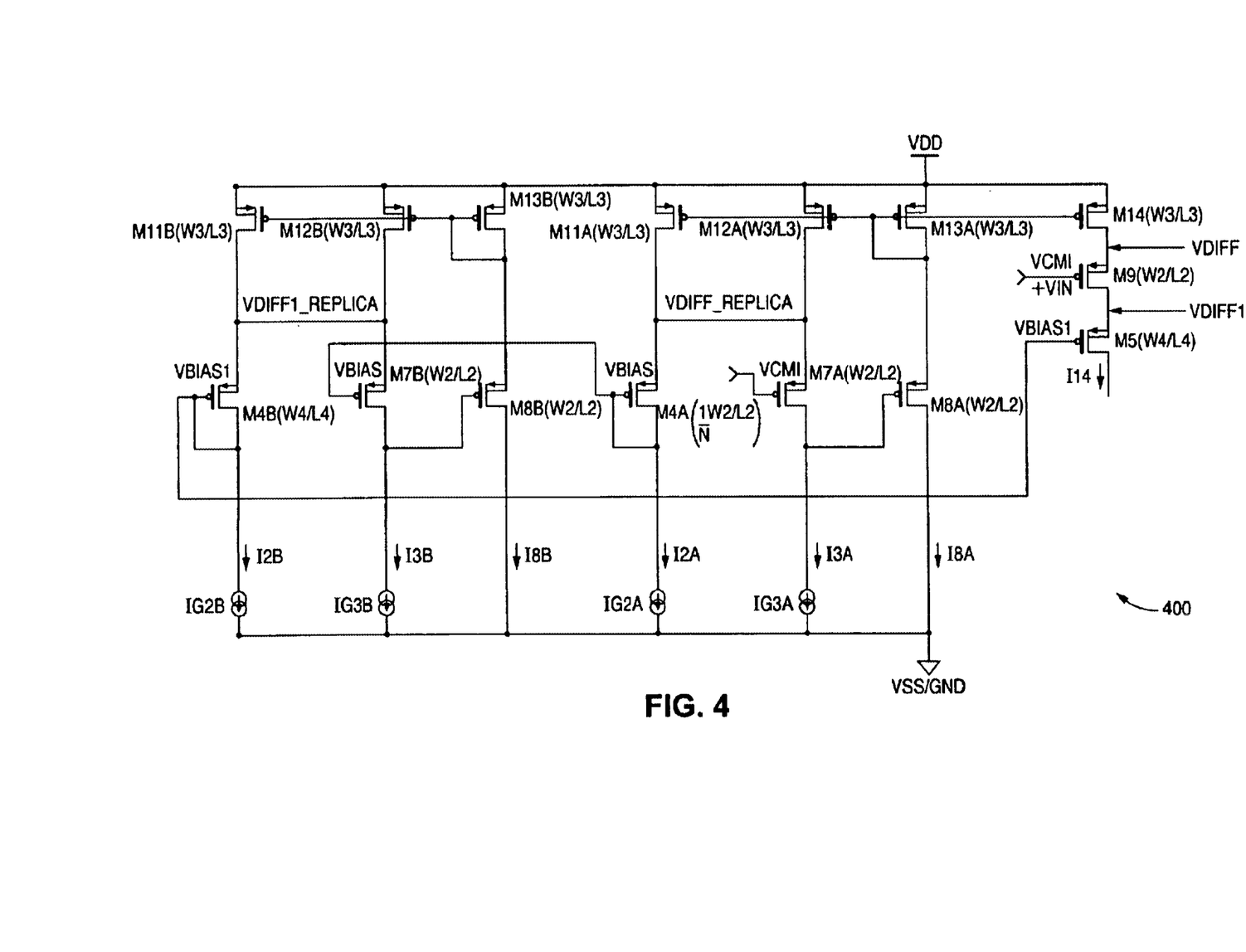
FIG. 4 is schematic diagram of a MOSFET amplifier with dynamically biased cascode output circuitry in accordance with yet another embodiment of the presently claimed invention.

Referring to FIG. 4, another embodiment 400 of the presently claimed invention uses a single output cascode transistor M5 similar to the circuits 100, 200 of FIGS. 1 and 2, and dual voltage replication and translation circuits similar to the circuit 300 of FIG. 3. However, by using the second, and lower, dynamic biasing voltage VBIAS1 for the single output cascode transistor M5, associated current source cascode transistor M4B and output cascode transistor M5 can have similar channel dimensions.

In conformance with the discussion herein, it will be appreciated and understood by one of ordinary skill in the art that a MOSFET amplifier with cascode output circuitry in accordance with the presently claimed invention can be implemented with the complementary MOSFET circuitry as expressly discussed herein, or alternatively with complementary MOSFET circuitry in which the P-MOSFETs are interchanged with the N-MOSFETs and the N-MOSFETs are interchanged with the P-MOSFETs with appropriate reversals in drain and source terminal connections and power supply voltage to provide an output current sink circuit topology rather than an output current source circuit topology.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a metal oxide semiconductor field effect transistor (MOSFET) amplifier with dynamically biased cascode output circuitry, comprising:
    first and second power supply terminals to convey first and second voltages defining a power supply voltage;
    telescopic cascode amplifier circuitry, coupled between said first and second power supply terminals, that responds to reception of a current source bias voltage intermediate said first and second voltages, an input signal centered about an input baseline voltage intermediate said first and current source bias voltages, and at least one cascode bias voltage intermediate said first and input baseline voltages by providing a first internal bias voltage intermediate said current source bias and input baseline voltages, a second internal bias voltage intermediate said input baseline and at least one cascode bias voltages, and an output signal corresponding to said input signal and centered about an output baseline voltage intermediate said first and cascode bias voltages;
    first voltage replication circuitry, coupled to said telescopic cascode amplifier circuitry, that responds to reception of said input baseline voltage and a first bias current by providing said current source bias voltage and a first replica bias voltage substantially equal to said first internal bias voltage; and
    first voltage translation circuitry, coupled to said first voltage replication circuitry and said telescopic cascode amplifier circuitry, that responds to reception of said current source bias voltage, said first replica bias voltage and a second bias current related to said first bias current by providing a first one of said at least one cascode bias voltage.

2. The apparatus of claim 1, wherein:
    said telescopic cascode amplifier circuitry comprises differential amplifier circuitry;
    said input baseline voltage comprises a common mode input signal voltage; and
    said output baseline voltage comprises a common mode output signal voltage.

3. The apparatus of claim 1, wherein said telescopic cascode amplifier circuitry comprises:
    current source transistor circuitry that responds to said current source bias voltage by providing an amplifier current;

input transistor circuitry, coupled to said current source transistor circuitry, that responds to reception of said amplifier current and said input signal by providing a signal current corresponding to said input signal; and cascode transistor circuitry, coupled to said input transistor circuitry, that responds to reception of said signal current and said at least one cascode bias voltage by providing said output signal.

4. The apparatus of claim 3, wherein:

said input transistor circuitry comprises differential input transistor circuitry;

said cascode transistor circuitry comprises differential cascode transistor circuitry;

said input baseline voltage comprises a common mode input signal voltage; and said output baseline voltage comprises a common mode output signal voltage.

5. The apparatus of claim 3, wherein said cascode transistor circuitry comprises a serial plurality of cascode transistors.

6. The apparatus of claim 3, wherein:

said first voltage translation circuitry comprises internal transistor circuitry that responds to reception of said first replica bias voltage and said second bias current by providing said first one of said at least one cascode bias voltage;

said internal transistor circuitry has associated therewith a first set of transistor dimensions defining a first transistor size;

said cascode transistor circuitry has associated therewith a second set of transistor dimensions defining a second transistor size; and said first transistor size is smaller than said second transistor size.

7. The apparatus of claim 1, wherein said first voltage replication circuitry comprises:

a current mirror transistor that responds to reception of said current source bias voltage by conducting said first bias current;

a cascode transistor, coupled to said current mirror transistor, that responds to reception of said input baseline voltage by conducting said first bias current and providing said first replica bias voltage and a feedback voltage; and feedback circuitry, coupled to said cascode transistor, said current mirror transistor and said telescopic cascode amplifier circuitry, that responds to reception of said feedback voltage by providing said current source bias voltage.

8. The apparatus of claim 1, wherein said first voltage translation circuitry comprises:

a current mirror transistor, coupled to said first voltage replication circuitry, that responds to reception of said current source bias voltage by conducting said second bias current; and a diode-connected transistor, coupled to said current mirror transistor, said first voltage replication circuitry and said telescopic cascode amplifier circuitry, that responds to reception of said first replica bias voltage by conducting said second bias current and providing said first one of said at least one cascode bias voltage.

9. The apparatus of claim 1, further comprising current replication circuitry, coupled to said first voltage replication circuitry and said first voltage translation circuitry, that responds to reception of a reference current by providing said first and second bias currents.

10. The apparatus of claim 1, further comprising:

second voltage replication circuitry, coupled to said first voltage translation circuitry, that responds to reception of said first one of said at least one cascode bias voltage and a third bias current related to said first bias current by providing a current mirror bias voltage and a second replica bias voltage substantially equal to said second internal bias voltage; and second voltage translation circuitry, coupled to said second voltage replication circuitry and said telescopic cascode amplifier circuitry, that responds to reception of said current mirror bias voltage, said second replica bias voltage and a fourth bias current related to said first bias current by providing a second one of said at least one cascode bias voltage.

11. The apparatus of claim 10, wherein said telescopic cascode amplifier circuitry comprises:

current source transistor circuitry that responds to said current source bias voltage by providing an amplifier current;

input transistor circuitry, coupled to said current source transistor circuitry, that responds to reception of said amplifier current and said input signal by providing a signal current corresponding to said input signal; and cascode transistor circuitry, coupled to said input transistor circuitry, that responds to reception of said signal current and said at least one cascode bias voltage by providing said output signal.

12. The apparatus of claim 11, wherein:

said input transistor circuitry comprises differential input transistor circuitry;

said cascode transistor circuitry comprises differential cascode transistor circuitry;

said input baseline voltage comprises a common mode input signal voltage; and said output baseline voltage comprises a common mode output signal voltage.

13. The apparatus of claim 11, wherein said cascode transistor circuitry comprises a serial plurality of cascode transistors.

14. The apparatus of claim 11, said first voltage translation circuitry comprises first internal transistor circuitry that responds to reception of said first replica bias voltage and said second bias current by providing said first one of said at least one cascode bias voltage;

said first internal transistor circuitry has associated therewith a first set of transistor dimensions defining a first transistor size;

said second voltage translation circuitry comprises second internal transistor circuitry that responds to reception of said second replica bias voltage and said fourth bias current by providing said second one of said at least one cascode bias voltage;

said second internal transistor circuitry has associated therewith a second set of transistor dimensions defining a second transistor size;

said cascode transistor circuitry has associated therewith a third set of transistor dimensions defining a third transistor size;

said first transistor size is smaller than said third transistor size; and said first and second transistor sizes are unequal.

15. The apparatus of claim 10, wherein said second voltage replication circuitry comprises:

a current mirror transistor that responds to reception of said current mirror bias voltage by conducting said third bias current;

a cascode transistor, coupled to said current mirror transistor and said first voltage translation circuitry, that responds to reception of said first one of said at least one cascode bias voltage by conducting said third bias current and providing said second replica bias voltage and a feedback voltage; and feedback circuitry, coupled to said cascode transistor and said current mirror transistor, that responds to reception of said feedback voltage by providing said current mirror bias voltage.

16. The apparatus of claim 10, wherein said second voltage translation circuitry comprises:

a current mirror transistor, coupled to said second voltage replication circuitry, that responds to reception of said current mirror bias voltage by conducting said fourth bias current; and a diode-connected transistor, coupled to said current mirror transistor, said second voltage replication circuitry and said telescopic cascode amplifier circuitry, that responds to reception of said second replica bias voltage by conducting said fourth bias current and providing said second one of said at least one cascode bias voltage.

17. The apparatus of claim 10, further comprising current replication circuitry, coupled to said first voltage replication circuitry, said first voltage translation circuitry, said second voltage replication circuitry and said second voltage translation circuitry, that responds to reception of a reference current by providing said first, second, third and fourth bias currents.

18. An apparatus including a metal oxide semiconductor field effect transistor (MOSFET) amplifier with dynamically biased cascode output circuitry, comprising:

power supply means for conveying first and second voltages defining a power supply voltage;

telescopic cascode amplifier means for receiving a current source bias voltage intermediate said first and second voltages, an input signal centered about an input baseline voltage intermediate said first and current source bias voltages, and at least one cascode bias voltage intermediate said first and input baseline voltages and in response thereto generating a first internal bias voltage intermediate said current source bias and input baseline voltages, a second internal bias voltage intermediate said input baseline and at least one cascode bias voltages, and an output signal corresponding to said input signal and centered about an output baseline voltage intermediate said first and cascode bias voltages;

first voltage replicator means for receiving said input baseline voltage and a first bias current and in response thereto generating said current source bias voltage and a first replica bias voltage substantially equal to said first internal bias voltage; and first voltage translator means for receiving said current source bias voltage, said first replica bias voltage and a second bias current related to said first bias current and in response thereto generating a first one of said at least one cascode bias voltage.

19. The apparatus of claim 18, further comprising:

second voltage replicator means for receiving said first one of said at least one cascode bias voltage and a third bias current related to said first bias current and in response thereto generating a current mirror bias voltage and a second replica bias voltage substantially equal to said second internal bias voltage; and second voltage translator means for receiving said current mirror bias voltage, said second replica bias voltage and a fourth bias current related to said first bias current and in response thereto generating a second one of said at least one cascode bias voltage.

* * * * *

UNITED STATES PATENT AND TRADEMARK OFFICE
CERTIFICATE OF CORRECTION

PATENT NO.   : 6,747,514 B1
DATED        : June 8, 2004
INVENTOR(S)  : Arlo Aude It is certified that error appears in the above-identified patent and that said Letters Patent is hereby corrected as shown below:

Column 2,
Line 66, please delete "arc" and replace with -- are --.

Column 3,
Line 56, please delete "abovle" and replace with -- above --.

Column 6,
Line 4, after the word "alternatively", please add -- , --.

Signed and Sealed this

Sixteenth Day of November, 2004

JON W. DUDAS
*Director of the United States Patent and Trademark Office*